United States Patent [19]
Sato et al.

[11] Patent Number: 4,762,803
[45] Date of Patent: Aug. 9, 1988

[54] PROCESS FOR FORMING CRYSTALLINE FILMS BY GLOW DISCHARGE

[75] Inventors: Noritada Sato; Yasukazu Seki, both of Yokosuka, Japan

[73] Assignee: Fuji Electric Co., Ltd., Kawasaki, Japan

[21] Appl. No.: 805,879

[22] Filed: Dec. 6, 1985

[30] Foreign Application Priority Data

Dec. 7, 1984 [JP] Japan ................................ 59-258492

[51] Int. Cl.$^4$ ........................................ H01L 21/365
[52] U.S. Cl. ...................................... 437/24; 437/87; 437/967; 427/39; 136/258
[58] Field of Search ................ 427/39; 156/610, 613; 437/24, 233, 967, 87; 136/258

[56] References Cited

U.S. PATENT DOCUMENTS

| | | | |
|---|---|---|---|
| 4,113,532 | 9/1978 | Authier | 148/174 |
| 4,226,898 | 10/1980 | Ovshinsky et al. | 427/39 |
| 4,392,011 | 7/1983 | Panove et al. | 136/261 |
| 4,410,558 | 10/1983 | Izu et al. | 427/39 |
| 4,492,736 | 1/1985 | Tanner | 427/39 X |

FOREIGN PATENT DOCUMENTS

| | | | |
|---|---|---|---|
| 0194521 | 11/1982 | Japan | 427/39 |
| 2033355 | 5/1980 | United Kingdom | 427/39 |

OTHER PUBLICATIONS

Nakata et al. "Novel Low Temperature ($\leq 300°$ C.) Annealing of Amorphous Si . . . ", Japanese J. Appl. Physics, vol. 21 (1982), pp. 211–216.

Miyao et al., "Electron Irradiation-Activated Low-Temperature Annealing of Phosphorus Implanted Silicon", Appl. Phys. Lett. 48 (17), Apr. 28, 1986, pp. 1132–1134.

*Primary Examiner*—Olik Chaudhuri
*Attorney, Agent, or Firm*—Brumbaugh, Graves, Donohue & Raymond

[57] ABSTRACT

Crystalline silicon films are formed by exposing a film of amorphous silicon on a substrate to a glow discharge in the presence of an inert gas such as argon. Masks can be used to allow for selective crystallization of defined regions of the amorphous film.

10 Claims, 2 Drawing Sheets

PROCESS FOR FORMING CRYSTALLINE FILMS BY GLOW DISCHARGE

BACKGROUND OF THE INVENTION

This invention relates to a method of forming crystalline silicon films. Various methods are known for forming crystalline silicon films including methods for the crystallization of previously formed amorphous silicon films, and methods for the direct deposition of crystalline silicon. For example, the following methods are known:

(1) After an amorphous silicon film is deposited on a substrate by an electron beam vapor deposition process, it is irradiated with laser or electron beams to convert it into a crystalline silicon film.

(2) When an amorphous silicon film is formed on a substrate heated to 1000° C. or higher by a chemical vapor deposition (CVD) process, the amorphous silicon film is crystallized and a crystalline silicon film is formed.

(3) An amorphous silicon film is heat-treated at 700°–1000° C. to convert it into a crystalline silicon film.

(4) A crystalline silicon film is formed by a plasma CVD process using a reaction gas of monosilane ($SiH_4$) gas diluted by hydrogen to its concentration of 5% or less.

(5) A crystalline silicon film is formed by a plasma CVD process using a reaction gas of a mixture of monosilane with helium gas.

Each of these known methods, however, suffers from disadvantages due to complex and expensive equipment or to extreme reaction conditions.

For example, deposition of amorphous silicon on a substrate using electron beam vapor deposition, followed by irradiation with a laser or an electron beam to crystallize the silicon not only involves elaborate apparatus, it also results in imposing thermal strain on the material due to the high temperatures generated during the crystallization process. High temperature is also a problem when amorphous silicon films are deposited by chemical vapor deposition processes and then recrystallized. Such processes are frequently carried out at temperatures in excess of 1000° C. Related processes in which crystallization results from simply heating amorphous silicon to 700°–1000° C. also cause thermal stress.

Crystalline silicon films can be deposited directly using a plasma CVD process. In these processes the mixture of silane and carrier gases is critical, and must be controlled relative to the glow discharge power. Moreover, both processes have slow deposition rates and poor uniformity of the crystalline film because of concentration of the discharge power density near the middle of the electrode.

Besides these drawbacks, none of these processes, with the exception of laser or electron beam irradiation, is conducive to selective crystallization of a part of an amorphous silicon film. Such selective crystallization is highly desirable in the fabrication of a number of different device types.

It is therefore an object of this invention to provide a method for forming crystalline silicon films at relatively low temperatures.

It is a further object of this invention to provide a method for crystallizing defined areas in an amorphous silicon film at relatively low temperatures.

SUMMARY OF THE INVENTION

Crystalline silicon films are formed according to this invention by exposing an amorphous silicon film to a glow discharge in the presence of an inert gas such as argon. The amorphous silicon film is placed in a vacuum vessel, and the inert gas is introduced to a pressure of about 0.1 Torr. The glow discharge is then energized, and the silicon is progressively crystallized at the relatively low temperature of about 200° C.

Selective crystallization of regions in the amorphous silicon film can also be accomplished using a mask. Under these circumstances, only the portion of the film which is exposed to the glow discharge is crystallized.

The crystallization process according to this invention can also be used with silicon films which contain dopants known in the art. In particular, silicon films doped with phosphorus or boron can be crystallized.

DETAILED DESCRIPTION OF THE INVENTION

Figure 1:
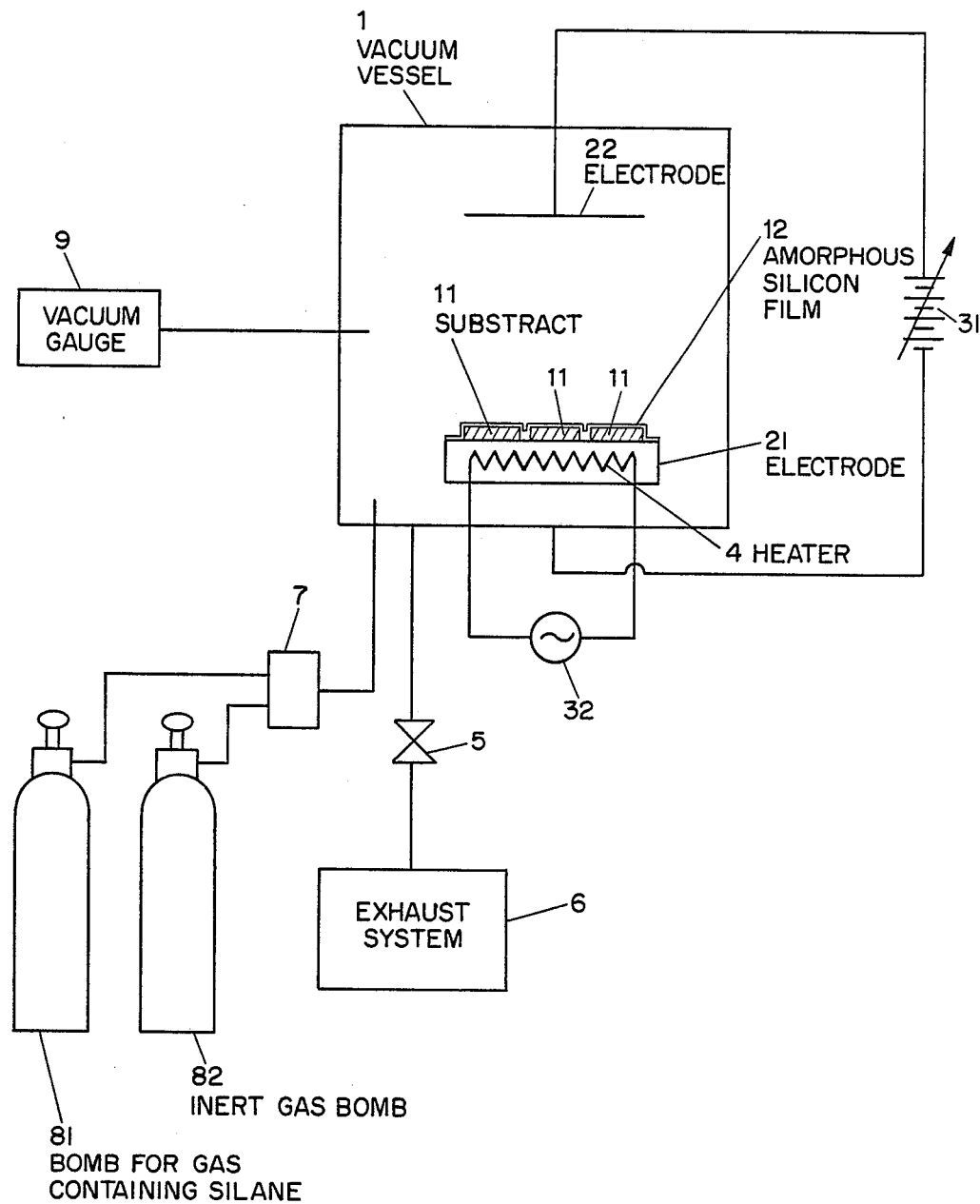
FIG. 1 is a schematic drawing of a reaction apparatus for carrying out the deposition and subsequent crystallization of a silicon film according to the invention.

FIG. 1 is a schematic drawing of reaction apparatus for depositing amorphous silicon films and then crystallizing the film according to the invention. Electrodes 21 and 22, connected to a direct current power source 31 for a glow discharge, are disposed in the upper and lower parts inside vacuum vessel 1. Electrode 21 is equipped with a heater 4 and heated by a power source 32. An exhaust system 6 is connected to the vacuum vessel 1 through a gas pressure controlling vacuum valve 5. A gas bomb 81 for a gas containing silane and an inert gas bomb 82 are connected to the vacuum vessel 1 through a controlling circuit 7 for controlling the pressure and flow of the reaction gas. A vacuum gauge 9 is also connected to vaccum vessel 1.

To form a crystalline silicon film using the apparatus, a substrate 11 is placed on the electrode 21 and heated, while the vacuum vessel is evacuated by the vacuum exhaust system 6. After a vacuum of about $1 \times 10^{-7}$ Torr is reached, the vacuum valve 5 is throttled to lower the exhaust rate of vacuum exhaust system 6. A silane containing gas is then introduced from gas bomb 81 into the vacuum vessel. For example, monosilane diluted with hydrogen to a concentration of 10% is introduced from the bomb 81 through the controlling circuit 7 into the vacuum vessel 1.

Subsequently, when voltage is applied between the electrodes 21 and 22 and a glow discharge is generated by a known method, an amorphous silicon film 12 is formed on the surface of the substrate 11 disposed on the electrode 21. Following deposition of the amorphous silicon film, an inert gas such as argon is introduced into the vacuum vessel and a glow discharge is generated in the inert gas atmosphere. The amorphous silicon film 12 formed on the substrate is converted into a crystalline silicon film with passage of glow discharge exposure time.

EXAMPLE

An amorphous silicon film of thickness of about 1 micron was formed under the following conditions:
Substrate: Quartz glass
Substrate temperature: 200° C.
Atmospheric gas: Monosilane diluted with hydrogen to a concentration of 10%
Pressure when glow discharge is generated: 10 Torr
Discharge power: DC 700V, 0.11 mA/cm$^2$
Distance between electrodes: 50 mm
Discharge time: 30 min.

Figure 2:
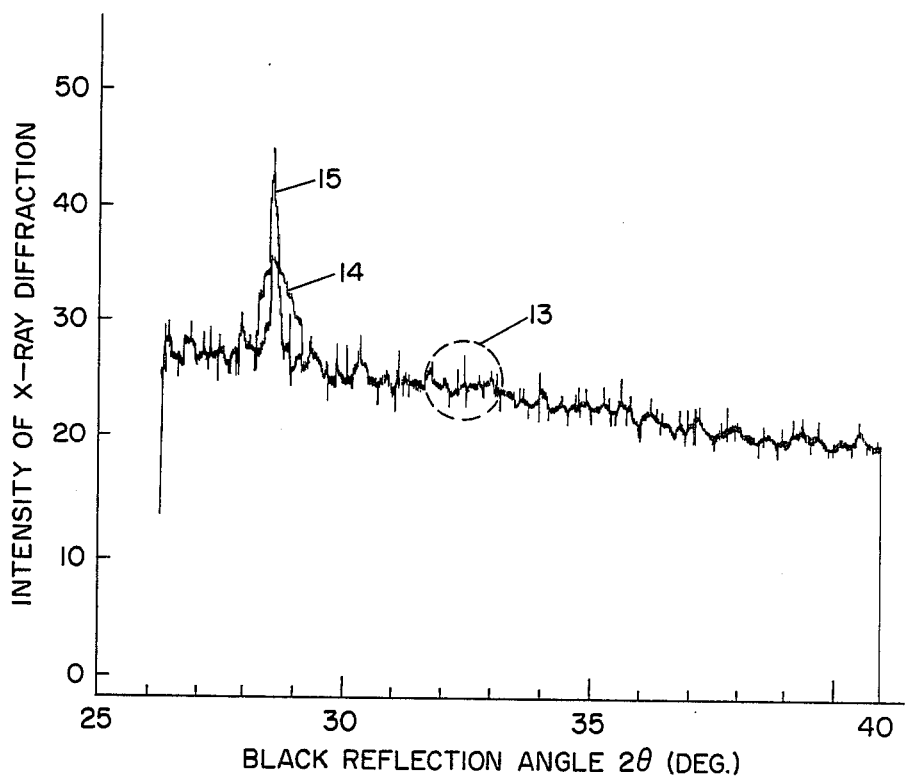
FIG. 2 shows an X-ray diffraction pattern of a silicon film prior to crystallization and after 60 and 180 minutes of crystallization according to the invention.

This film was then converted into crystalline silicon by a process according to the invention under the following conditions:
Inert gas: Argon
Pressure when glow discharge is generated: 0.1 Torr
Discharge power: DC 600V, 0.57 mA/cm$^2$
Discharge time: 60 min, 180 min FIG. 2 shows the X-ray diffraction pattern of the amorphous silicon and crystalline silicon films. The pattern has been obtained using the Cu-K line which is allowed to penetrate a Ni filter; the applied voltage is 35 kV; and the current is 15 mA. The axis Y shows the intensity of diffracted X-rays and the axis X shows a back reflection angle from the silicon surface. When the amorphous silicon film crystallizes, a peak appears in the X-ray diffraction pattern. Line 13 shows the X-ray diffraction pattern of the amorphous silicon film and peaks such as 14 and 15 do not appear in it. Lines 14 and 15 show the X-ray diffraction patterns after exposure to the discharge for 60 min and 180 min respectively under the above-mentioned conversion conditions. With passage of the discharge exposure time, the crystallization progresses so that the peak of X-ray diffraction pattern on (111) face becomes more conspicuous.

Figure 3:
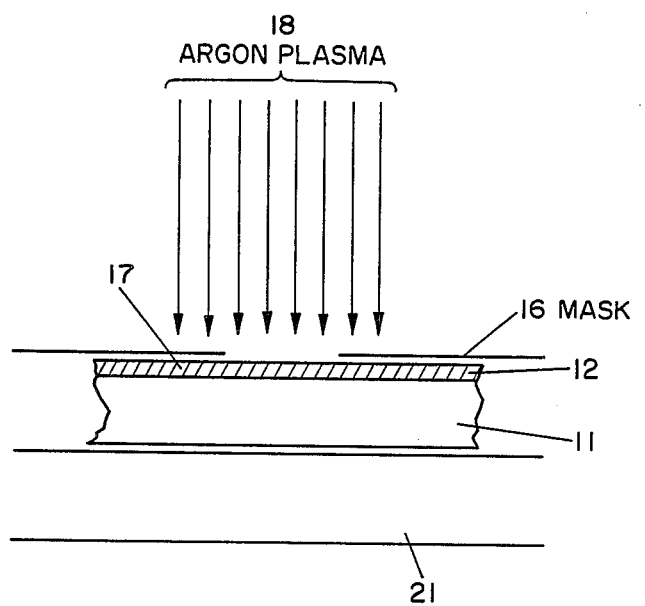
FIG. 3 shows a section through a substrate covered with a silicon film with a part of the film being selectively crystallized according to the invention.

The formation of crystalline silicon from a film of amorphous silicon according to the invention can also be carried out in such a manner that selected regions of the film are crystallized while the remainder stays amorphous. As shown in FIG. 3, a mask 16 consisting of, for example, a stainless steel plate is disposed above the amorphous silicon film 12 formed on the substrate 11 and then glow discharge is generated in an argon gas atmosphere under the same conditions as in the above example. As a result, a part 17 of the amorphous silicon film 12 is irradiated with argon plasma 18 and it is converted into a crystalline silicon film. Preferred masks for use in this application are from 0.1 to 0.3 mm thick, and may be prepared from any material which neither decomposes nor distorts in the plasma.

As the reason for conversion of the amorphous silicon film into the crystallitic silicon film in the above-mentioned examples, it is believed that dissociated ions of the inert gas, for example Ar$^+$ ions, are accelerated in the electric field and collide with the amorphous silicon film, the kinetic energy of these ions being absorbed in the film. As a result, the amorphous silicon film is converted into a crystalline silicon film.

In the above-mentioned examples, conversion into the crystalline silicon film using an argon gas was discussed. However, a glow discharge can also be generated in an inert gas atmosphere such as helium, neon, or nitrogen to convert the amorphous silicon film into a crystalline silicon film.

The invention provides a method for forming a crystalline silicon film at low temperatures of about 200° C. In the process, after an amorphous silicon film is formed on a substrate, the amorphous silicon film is converted into a crystalline silicon film by generating a glow discharge in an inert gas atmosphere above the amorphous film. It will be understood that while deposition of the amorphous silicon film by glow discharge techniques is preferred, crystallization of amorphous silicon films according to this invention can be effectively carried out on any amorphous silicon film, regardless of the method of film deposition. In addition, doped silicon films, containing, for example, phosphorus or boron can also be crystallized by this method.

The crystalline silicon film formed according to this invention has several advantages over prior art films. It has a lower specific resistance than crystalline silicon films formed by other low temperature methods and there is good uniformity of grain boundaries within the film. In addition, it is possible to form a crystalline silicon region having an arbitrary area at an arbitrary location on the amorphous silicon film.

The invention is especially advantageous when devices like the following are prepared.

(1) Highly efficient solar cell having amorphous silicon films combined with crystalline silicon films can be prepared by a simple changeover of the gas to be introduced into the same reaction tank, so that automated production is easy.

(2) If the crystalline silicon region is applied to the wiring of an integrated circuit, formation of the region does not require such a high temperature (of 800°-1000° C.) as required for the wiring of the conventional multicrystal silicon, so that adverse effects on characteristics of integrated semi-conductor elements can be avoided.

(3) It is also possible to carry our multilayer wiring having a crystalline silicon region of arbitrary shape embedded in the amorphous silicon film, so that a three dimensional element can be manufactured readily at a low temperature.

The method embodiments described above are intended only to be illustrative. It will be understood that modifications in form and detail may be made within the scope of the following claims.

We claim:

1. A method for crystallizing an amorphous silicon film on a substrate comprising in sequence the steps of:
   (a) placing the substrate and amorphous silicon film into a vacuum chamber;
   (b) introducing an inert gas into the vacuum chamber to form an atmosphere consisting essentially of the inert gas within the vacuum chamber; and
   (c) genereating a glow discharge within the inert gas atmosphere in the vacuum chamber whereby the amorphous silicon is converted to a crystalline silicon film.

2. A method according to claim 1, wherein the inert gas is selected from the group consisiting of argon, helium, neon and nitrogen.

3. A method according to claim 1, wherein the amorphous silicon film is partially covered by a mask, such that only the exposed portion of the silicon film is crystallized.

4. A method according to claim 1, wherein the amorphous silicon film contains a dopant.

5. A method according to claim 1, wherein the amorphous silicon film is converted to a crystalline silicon film at a temperature of about 200° C.

6. A method for forming a crystalline silicon film on a substrate comprising in sequence the steps of:
   (a) heating the substrate in a vacuum vessel;

(b) introducing a reaction gas containing silicon hydride into the vacuum vessel;

(c) generating a glow discharge within the vacuum vessel so that an amorphous silicon film is deposited on the substrate;

(d) removing any residual reaction gas from the vacuum vessel;

(e) introducing an inert gas into the vacuum vessel to form an atmosphere consisting essentially of the inert gas within the vacuum vessel; and (f) generating a glow discharge within the inert gas atmosphere in the vacuum vessel whereby the amorphous silicon film is converted to a crystalline silicon film.

7. A method according to claim 1, wherein the inert gas is selected from the group consisting of argon, helium, neon and nitrogen.

8. A method according to claim 1 additionally comprising placing a mask over a part of the amorphous silicon film prior to step f, so that only the exposed part of the silicon film is crystallized.

9. A method according to claim 1, wherein the amorphous silicon film contains a dopant.

10. A method according to claim 1, wherein the amorphous silicon film is converted to a crystalline silicon film at a temperature of about 200° C.

* * * * *

UNITED STATES PATENT AND TRADEMARK OFFICE
CERTIFICATE OF CORRECTION

PATENT NO. : 4,762,803

DATED : August 9, 1988

INVENTOR(S) : Sato et al.

It is certified that error appears in the above-identified patent and that said Letters Patent is hereby corrected as shown below:

Column 6, line 3, "claim 1" should read --claim 6--;
Column 6, line 6, "claim 1" should read --claim 6--; and
Column 6, line 10, "claim 1" should read --claim 6--.

Signed and Sealed this

Fourteenth Day of March, 1989

Attest:

DONALD J. QUIGG

*Attesting Officer*  *Commissioner of Patents and Trademarks*